(12) United States Patent
Diana et al.

(10) Patent No.: US 7,344,897 B2
(45) Date of Patent: Mar. 18, 2008

(54) FERROELECTRIC POLYMER MEMORY STRUCTURE AND METHOD THEREFOR

(75) Inventors: Daniel C. Diana, Portland, OR (US); Carolyn R. Duran, Portland, OR (US); Robert C. Lindstedt, Portland, OR (US); Marian E. Silberstein, Gaston, OR (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 11/124,497

(22) Filed: May 4, 2005

(65) Prior Publication Data
US 2006/0252161 A1 Nov. 9, 2006

(51) Int. Cl.
*H01L 21/00* (2006.01)
(52) U.S. Cl. .................. 438/3; 438/253; 438/623; 438/624; 438/669
(58) Field of Classification Search .............. 438/3, 438/253, 623–624, 669
See application file for complete search history.

(56) References Cited

U.S. PATENT DOCUMENTS

| | | | |
|---|---|---|---|
| 6,624,457 B2 * | 9/2003 | Li et al. | 257/295 |
| 6,785,118 B1 | 8/2004 | Liu et al. | |
| 6,878,980 B2 * | 4/2005 | Gudesen et al. | 257/295 |
| 7,049,153 B2 * | 5/2006 | Agarwal et al. | 438/3 |
| 7,078,754 B2 * | 7/2006 | Hussein et al. | 257/295 |
| 2003/0017623 A1 * | 1/2003 | Li et al. | 438/3 |
| 2003/0017627 A1 * | 1/2003 | Li et al. | 438/3 |
| 2003/0053351 A1 * | 3/2003 | Oh et al. | 365/200 |
| 2004/0152231 A1 * | 8/2004 | Li et al. | 438/99 |
| 2004/0209420 A1 * | 10/2004 | Ljungcrantz et al. | 438/239 |
| 2005/0084985 A1 | 4/2005 | Hussein et al. | |
| 2006/0046479 A1 * | 3/2006 | Rajagopalan et al. | 438/683 |

OTHER PUBLICATIONS

U.S. Appl. No. 10/814,216, filed Mar. 31, 2004, Campbell et al.
U.S. Appl. No. 10/816,259, filed Mar. 31, 2004, Renavikar et al.
U.S. Appl. No. 10/882,423, filed Jun. 30, 2004, Steger et al.
U.S. Appl. No. 11/096,389, filed Mar. 31, 2005, Dubin et al.

\* cited by examiner

*Primary Examiner*—M. Wilczewski
*Assistant Examiner*—Bac H. Au
(74) *Attorney, Agent, or Firm*—Blakely, Sokoloff, Taylor & Zafman LLP

(57) ABSTRACT

A ferroelectric polymer memory device and its method of formation are disclosed. In accordance with one embodiment, lower electrode memory device portions are formed using a damascene patterning process and upper electrode memory device portions are formed using a subtractive patterning process.

7 Claims, 3 Drawing Sheets

FERROELECTRIC POLYMER MEMORY STRUCTURE AND METHOD THEREFOR

FIELD OF THE INVENTION

Embodiments of the present invention relate generally to integrated circuit manufacturing and more particularly to the manufacture of memory devices.

BACKGROUND OF THE INVENTION

In a normal dielectric material, upon the application of an electric field, positive and negative charges will be displaced from their original position—a concept which is characterized by the dipole moment or polarization. This polarization, or displacement, will vanish, however, when the electric field returns back to zero. On the other hand, in a ferroelectric material, there is a spontaneous polarization—a displacement which is inherent to the crystal structure of the material that does not disappear in the absence of the electric field. The direction of this polarization can be reversed or reoriented by applying an appropriate electric field.

Ferroelectric polymers are a class of ferroelectric materials potentially targeted for use in non-volatile memory applications. Integrated circuits which use ferroelectric polymers are generally referred to as ferroelectric polymer memory devices (FPMDs). These devices typically comprise intersecting bottom and top metal electrodes and an intervening ferroelectric polymer film (FPF). The FPF constitutes the core of the memory bit for the FPMD. Because transistors are not required, FPMD memory arrays can be stacked in three dimensions. This means they can be used to fabricate higher-density memories than are otherwise possible using conventional silicon-based transistor technologies.

However, conventional FPMD manufacturing methods are not without their problems. One such problem includes the ability to pattern multiple electrode layers without physically damaging or degrading the ferroelectric properties of the FPE. This can be a concern when fabricating FPMDs using damascene and subtractive metal patterning processes and/or when using conventional materials such as aluminum to form the electrodes. The etch processes used to form damascene structures can damage the FPE in regions where electrodes are formed. This is because intervening FPE regions can be exposed to etchants during damascene processing. On the other hand, subtractive etch processes, while not as damaging to the FPE in critical locations as damascene processes, are inherently non-uniform. As the number of electrode levels increases, so too does surface non-uniformity. For multi-level electrode devices, non-uniformities can become so severe that they impact the ability to pattern/etch the electrodes. Finally aluminum, while relatively easy to etch, can diffuse into the FPE and over time and position it, thereby affecting its ferroelectric properties. To the extent that FMD's ferroelectric properties are affected by any one of these, the FPMD's functionality, reliability and/or yield can be impacted.

Figure 1:
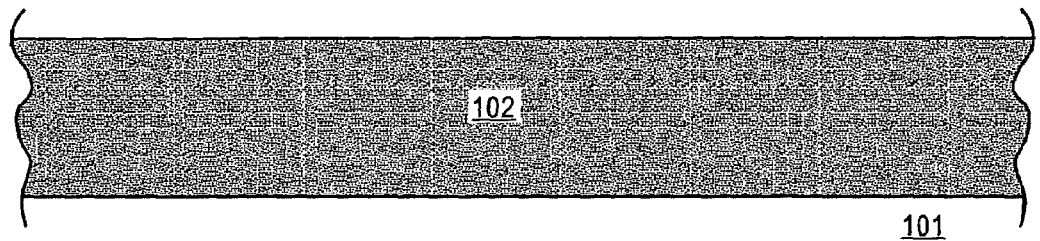
FIGS. 1-9 illustrate, in cross-sectional views, processing steps that can be used to fabricate a ferroelectric polymer memory device in accordance with an embodiment of the present invention.

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an integration scheme is disclosed for the fabrication of ferroelectric polymer memory devices. Reference is made to the accompanying drawings within which are shown, by way of illustration, specific embodiments by which the present invention may be practiced. It is to be understood that other embodiments may exist and that other changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

One or more embodiments of the present invention provide a method for patterning ferroelectric polymer memory electrodes in such as way as to minimize process induced degradation to the polymer's ferroelectric properties. In one embodiment, a combination of inlaid and subtractive patterning processes is used to fabricate ferroelectric capacitors (i.e. capacitors that include a ferroelectric polymer film sandwiched between two conductive electrodes). The ferroelectric capacitors can be used, for example, as memory cells in a semiconductor device memory array.

In one embodiment, capacitor electrodes can be formed using noble metal(s), such as for example gold. In one embodiment, capacitors in one array can be formed over capacitors in an underlying array. In one embodiment, the ferroelectric capacitors are fabricated as a basic unit "bilayer" cell which comprises at least two vertically stacked ferroelectric capacitors that share a common electrode. In one embodiment, a conductive layer can be formed on/in an overlying ILD to facilitate formation of interconnects, vias, and/or bottom electrodes for subsequently formed ferroelectric capacitors. In one embodiment, a combination of inlaid (damascene) and subtractive patterning processes are used to fabricate "building block" structures wherein planarity can be controlled within each building block. These building blocks can then be used in combination to fabricate increased density integrated circuits and at the same time preserve overall substrate planarity. Aspects of these and other embodiments will be discussed herein with respect to FIGS. 1-9, below, which illustrate, in cross-sectional diagrams, formation of a bilayer memory array in accordance with an embodiment of the present invention. The drawings, however, should not be taken to be limiting, as they are intended for the purpose of explanation and understanding.

Shown in FIG. 1 is an illustration of a partially fabricated semiconductor device. The semiconductor device includes one or more base layers 101. Under the base layers 101 is a substrate (not shown) which is typically a semiconductor wafer. The substrate's material typically includes silicon, silicon germanium, gallium arsenide or other III-V compounds, silicon carbide, silicon-on-insulator (SOI), or the like.

The multi-layered region (base layer(s)) 101 can include a combination of dielectric, semiconductive, and/or conductive layers that have been photolithographically patterned and etched to form semiconductor device structures over, on, or within the substrate. For example, region 101 may include one or more of various dielectric layers such as silicon nitride, silicon dioxide, tetraethylorthosilicate (TEOS), borophosphosilicate glass (BPSG), spin-on-glass (SOG), low-k materials, high-k materials, or the like. The region 101 may also contain semiconductive features that include one or more of epitaxial silicon, polysilicon, amorphous silicon, doped polysilicon, or the like. In addition, the multi-layer region 101 can also include conductive features or metallic layers that include one or more of refractory silicides, refractory metals, aluminum, copper, alloys of these materials, conductive nitrides, conductive oxides, or the like. To the extent that the interlayer dielectric 102 is formed over a wafer containing CMOS transistors, it may be advantageous to include a barrier layer, for example a nitride layer, between the ILD 102 and the transistors. The barrier layer may help to prevent metal from subsequently formed capacitor electrodes (discussed in FIGS. 3-9) from diffusing down to the CMOS transistors and impacting their operation.

Overlying base layer(s) 101 is an interlayer dielectric (ILD) 102. In accordance with one embodiment, the ILD 102 is a conventional silicon dioxide based film deposited using plasma enhanced chemical vapor deposition (PECVD). Alternatively, the ILD 102 can include other conventional insulator materials, such as for example fluorinated silicon dioxide, tetraethylorthosilicate (TEOS), borophosphosilicate glass (BPSG), BPTEOS, low dielectric constant (low-k) materials, polymeric materials or the like. These materials can be formed using conventional methods, such as for example, chemical vapor deposition (CVD), PECVD, and/or a spin-on process. Typically the thickness of the ILD 102 is in a range of approximately 2000-5000 Angstroms.

Figure 2:
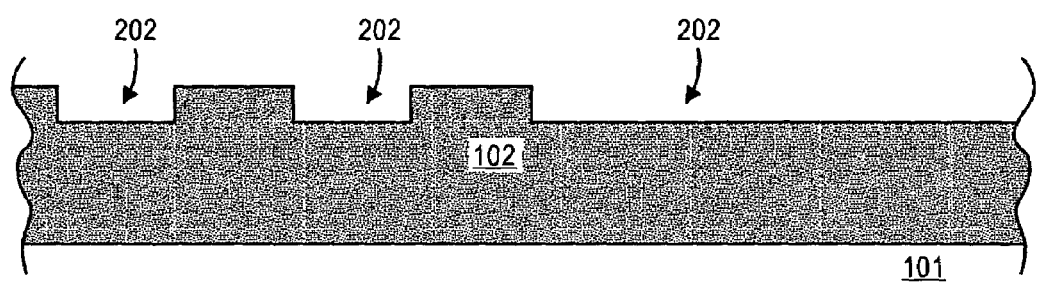

Referring to FIG. 2, the ILD 102 has been patterned (i.e., coated with resist, then lithographically exposed and developed followed by a conventional wet and/or dry etch process and then the resist removed) to form damascene trench structures 202 within the ILD 102. The depth of the trench corresponds approximately to the thickness of an electrode that will subsequently occupy portions of the trench. In one embodiment, this depth/thickness is in a range of 1000-2000 Angstroms.

Figure 3:
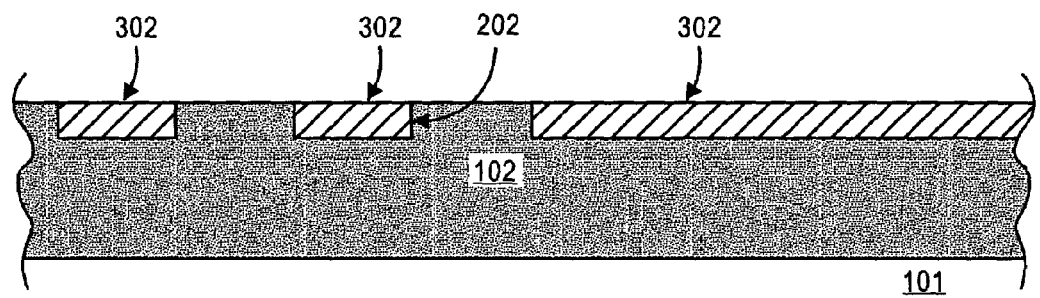

Then, as shown in FIG. 3, a conductive material is formed within the trench structures to define lower electrode portions 302 for a ferroelectric capacitor structure. In accordance with one embodiment, the conductive material can be a noble metal, such as rhenium, ruthenium, rhodium, palladium, silver, osmium, iridium, platinum, or gold. In one specific embodiment the conductive material includes gold. An adhesion promotion layer, for example an organic adhesion promoter or a refractory metal layer, such as a layer of titanium, (not shown) can be formed between the conductive material and the ILD 102. The adhesion promotion and/or conductive layers can be deposited using, for example, conventional physical vapor deposition processes (e.g. sputtering or evaporation). Alternatively, processes such as CVD, electroplating, or electroless deposition can be used to deposit the adhesion promotion layer and/or conductive material. In embodiments where the adhesion promotion layer is an organic material, it can alternatively be deposited using a spin-on or spray-on process. In one specific embodiment, where titanium is used as the adhesion promotion layer and gold is used as the conductive material, the titanium and gold layers can be deposited using a sputtering process. Excess adhesion promotion layer and conductive material (i.e. material not contained within the trench regions 202) can be removed using a suitable chemical mechanical planarization (CMP) processes to thereby define the electrodes 302. This process (i.e. the process used to form the electrodes 302) is commonly known to one of ordinary skill as damascene processing.

Figure 4:
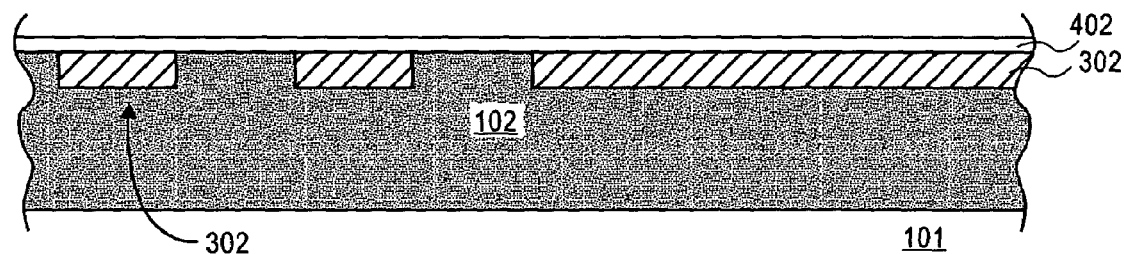

Turning to FIG. 4, a first ferroelectric polymer layer 402 is deposited over the substrate 102 and the conductive material 302. In accordance with one embodiment, the first ferroelectric polymer layer 402 includes polymers such as poly(vinylidene fluoride-trifluoroethylene) (PVDF-TrFE), copolymers of PVDF-TrFe, PVDF mono polymers, or the like, and it can be deposited using a conventional spin-on/cure process. The thickness of the first ferroelectric polymer layer 402 is typically in a range of 600-1100 Angstroms. Alternatively, the first ferroelectric polymer layer 402 can be formed using other materials and using other processes as known to one of ordinary skill.

Figure 5:
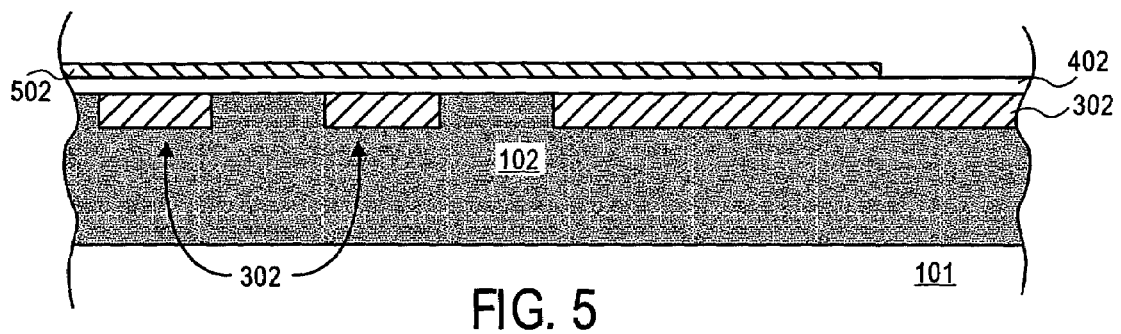

Next, as shown in FIG. 5, an upper electrode portion 502 of a capacitor structure is formed over the first ferroelectric polymer material 402. The upper electrodes 502 typically extend in a direction orthogonal to that of the lower electrode 302. The combination of the upper electrode 502, the first ferroelectric polymer 402, and the lower electrode 302 forms a first array of individual memory cells in a memory circuit.

In one embodiment, the conductive material used to form the upper electrode 502 includes a noble metal deposited using conventional means. In one specific embodiment, the upper conductive material is a gold material that has been evaporated onto the ferroelectric polymer film 402. Typically this conductive material is deposited to a thickness of approximately 400-500 Angstroms. In embodiments wherein the conductive material is gold, it may be advantageous to cap it with titanium. The titanium cap can function as an adhesion promoter between the electrode 502 and a subsequently formed ferroelectric polymer layer (e.g. layer 602 in FIG. 6). The titanium cap can be formed using known methods such as CVD or physical vapor deposition (PVD), and it only needs to be thick enough to function as an adhesion promoter. In alternative embodiments, other materials such as organic adhesion promoters, as known to one of ordinary skill, may be used.

The conductive material (and adhesion promoter cap, if present) is then coated with resist and/or a hardmask (e.g. an oxide hardmask). The resist and/or hardmask is then photolithographically exposed and developed to define a pattern that exposes regions of the conductive layer (or the adhesion promoter cap if present). After which, exposed portions of the conductive layer/adhesion promoter cap are removed using a conventional wet or dry etch process. This process sequence (i.e. resist patterning followed by etching of exposed regions of the underlying layer) is generally referred a subtractive patterning process by one of ordinary skill.

Figure 6:
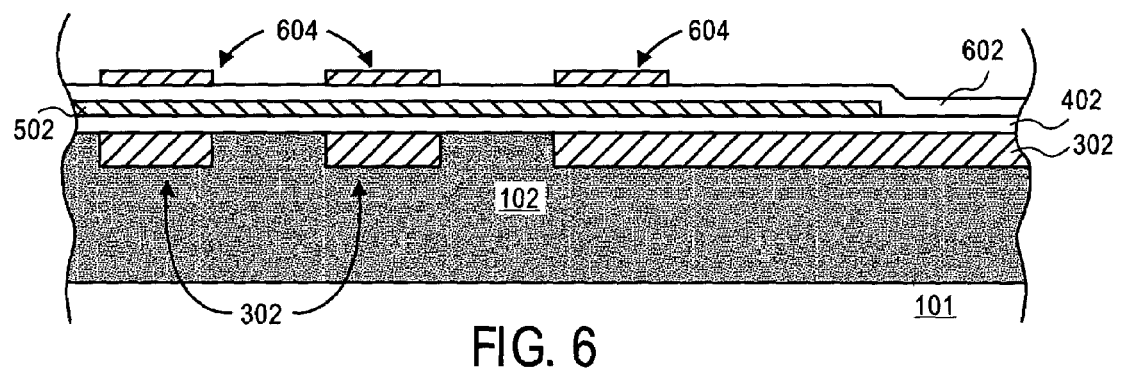
Figure 7:
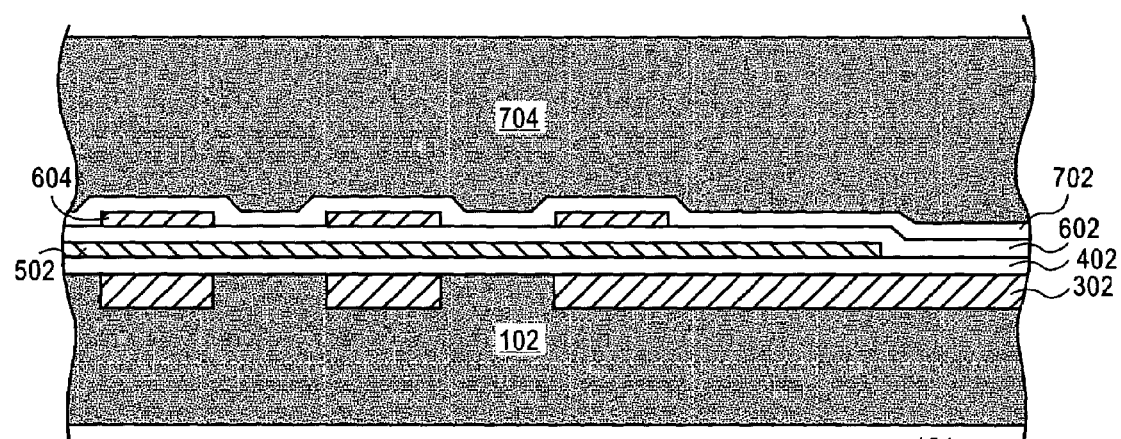

Turning to FIG. 6, a cross-sectional view of the substrate shown in FIG. 5 is shown after forming a second ferroelectric polymer material 602 and uppermost electrodes 604 over the first ferroelectric polymer material 402 and the upper electrode 502. The electrodes 604 are typically orthogonally oriented relative to the electrodes 502. The combination of the upper electrodes 502, the second ferroelectric polymer film 602, and the uppermost electrodes 604 forms a second array of individual memory cells in the memory circuit. In one embodiment, the second array overlies the first array. In one embodiment, the upper electrode 502 is shared between lower electrode 302 and uppermost electrode 604.

The second ferroelectric polymer material 602 can be formed using materials and processes similar to those used to form first ferroelectric polymer material 402. In addition, its thickness can be similar to that of ferroelectric polymer film 402. In one embodiment, its thickness is in a range of approximately 600-1100 Angstroms. Similarly, the uppermost electrodes 604 can be formed using materials and processes and/or use adhesion promoters similar to those used to form upper electrode 502. In addition, its thickness can be similar to that of the upper electrodes 502. In one embodiment, its thickness is in a range of approximately 400-500 Angstroms In FIG. 7, an optional intermediate dielectric layer 702 has been deposited over the electrodes 604 and portions of the second ferroelectric polymer material 602. And, a second dielectric layer 704 has been deposited over the intermediate dielectric layer 702. In one non-limiting embodiment, the intermediate dielectric layer 702 is a spin-on polymer material as known to one of ordinary skill. In one specific embodiment, the intermediate dielectric layer 702 is a ferroelectric polymer material (i.e. the third ferroelectric polymer material). To the extent that it is a ferroelectric polymer, the third ferroelectric polymer material can be deposited using materials and using processes similar to those used to form underlying ferroelectric polymer material layers 402 and 602. Like the layers 402 and 602, intermediate dielectric layer 702 typically has a thickness in a range of approximately 600-1100 Angstroms. To the extent that it is spun on, the intermediate dielectric layer 702 facilitates planarization of the surface of the substrate prior to depositing the ILD 704. And, in embodiments wherein the conductive material includes gold, it can provide a surface on which the ILD 704 can better adhere to (i.e. function as an adhesion promoter).

The ILD 704 can be formed using processes and materials similar to those used to form ILD 102. Typically the film 704 has a thickness in a range of approximately 2000-5000 Angstroms. Care should be exercised to deposit the ILD at temperatures that will not detrimentally impact the ferroelectric properties of the FPE layers 402 and 602. To the extent that PVDE-TrFE polymers or the like are used to form the FPEs 402 and 602, then it may be advantageous to form ILD 704 using a process that can deposit the film at temperatures less than approximately 120 degrees Celsius. One of ordinary skill can appreciate that from this point on subsequent processes should similarly not exceed temperatures that could impact the FPE's ferroelectric properties or exceed the polymer's melting point.

Figure 8:
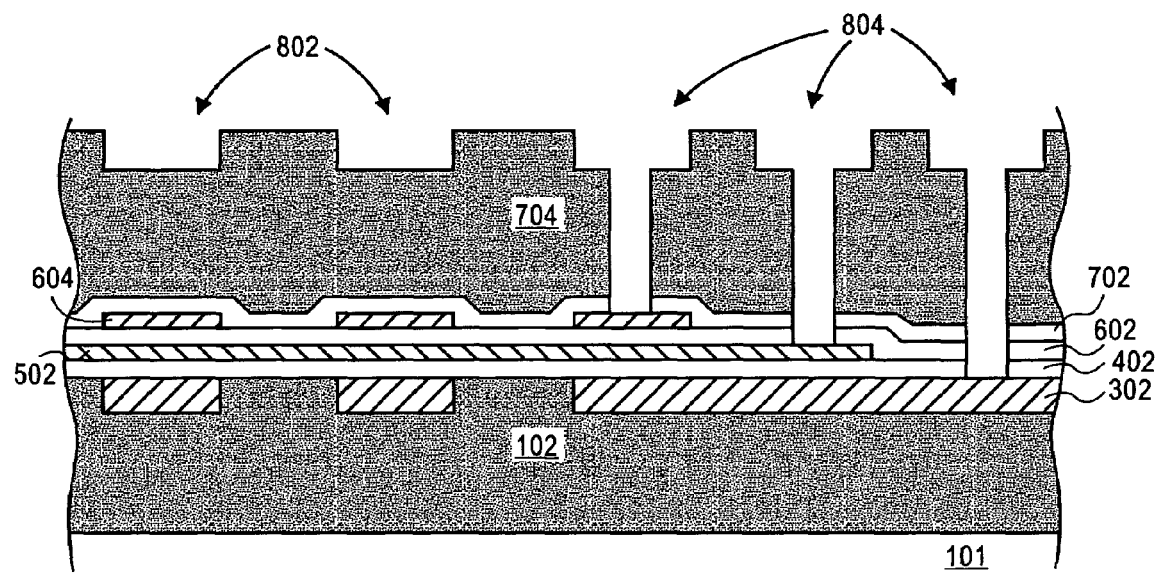
Figure 9:
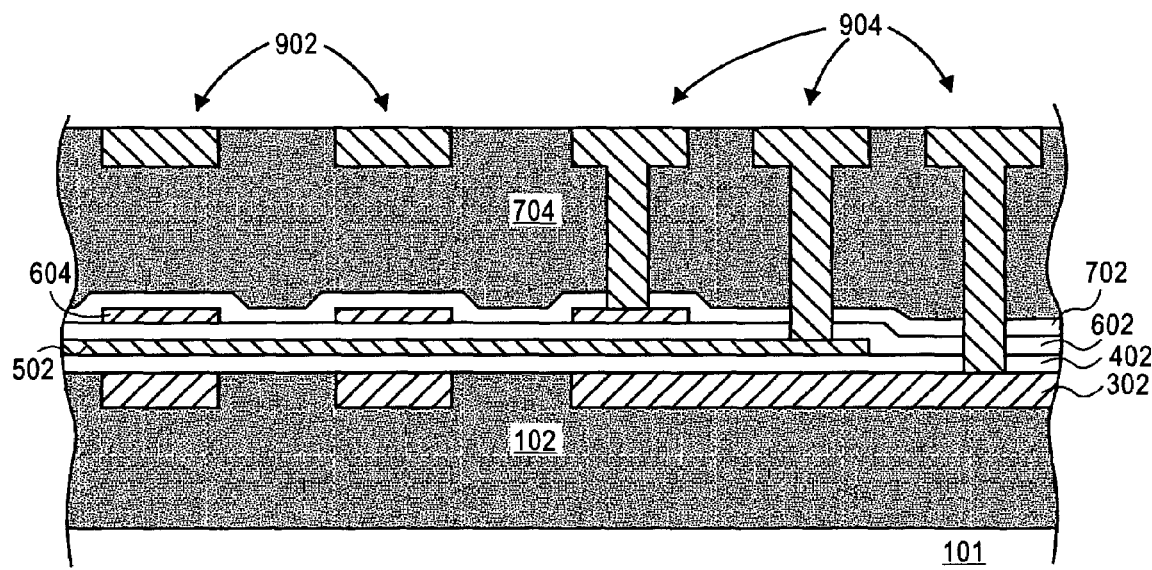

Turning now to FIG. 8, trench/via openings 804 have been formed in the ILD 704 using conventional damascene patterning processes (similar to the process used to form trenches 202 in FIG. 2). And, as shown in FIG. 9, the trench/via openings have been filled with a conductive material and interconnect/via structures 904 have been formed. The trench/via structures can be formed using a CMP polish process similar to that used to form electrodes 302. Like electrodes 302, the conductive material used to fill the trench/via structures is preferably a noble metal. In accordance with one embodiment, the conductive material includes gold and an adhesion promoter (e.g., an organic adhesion promoter or a refractory metal adhesion promoter, such as a titanium layer) formed in the openings prior to depositing the gold. Typically the thickness of the electrode structure is in a range of approximately 1000-2000 Angstroms. To the extent that embodiments encompass the formation of subsequent overlying memory arrays for the integrated circuits, then trenches 802 (FIG. 8) can be included in the ILD 704 and filled with conductive material to form lower electrodes 902 for the subsequent memory arrays.

As indicated by FIG. 9, some interconnects 904 can be used to electrically couple to respective electrode regions 302, 502, and/or 604. In this way specific memory cells in the array can be programmed/read/erased by applying biasing potentials to appropriate electrodes.

As shown in FIG. 9, the surfaces of the ILD 704 and conductive material used to form interconnects 902 and 904, unlike the surface of the underlying conductive layers 502 and 604 and ferroelectric polymer films 402, 602, and 702, are planarized during or after the interconnects 902 and 904 are formed. In this way, non-uniformities resulting from the subtractive patterning process used to form the upper and uppermost capacitor electrodes can be contained between the ILD 704 and ILD 102.

Therefore, unlike conventional subtractive patterning processes, which propagate substrate surface non-planarity as the number of metal layers increases, at least one embodiment of the present invention can be used to form discrete building block levels of electrodes and/or interconnects, wherein the surface of each building block is relatively planar. Because it is expected that ferroelectric polymer memory devices will be constructed with as many as 10-14 or more electrode levels, non-planarity problems, which would otherwise be severe, can be overcome using the building block approach disclosed herein. Reducing the cumulative effects of non-planarity increases the lithography process window and thereby makes it much easier to subtractively pattern the electrode levels independent of where they are in the stack.

In the various embodiments discussed herein, methods for forming ferroelectric polymer memory devices have been disclosed. In one embodiment, damascene and subtractive etch patterning methods are combined to obtain a significant reduction in topography. The use of damascene processing to form interconnects with the various electrode layers can be leveraged to provide via scalability for next generation ferroelectric polymer memory devices. In addition, the integration of the damascene patterning process in the ILD capping layer provides a stable platform for forming subsequent electrodes (i.e. it can be the foundation for adding subsequent memory array building blocks). At least one embodiment of the present invention overcomes prior art problems associated with FPEs and damascene processing by limiting the formation of damascene structures to within non-ferroelectric polymer films (e.g., ILDs 102 and 704). In other embodiments, processing-induced interface damage to the ferroelectric polymer can be reduced by using a noble metal to form the electrodes and/or using subtractive etching processes.

While embodiments of the present invention disclose a detailed combination of damascene and subtractive patterning processes to form noble metal electrodes under or on ferroelectric polymer films, one of ordinary skill should appreciate that this is but one possible integration scheme for forming ferroelectric capacitors. For example, in addition to the formation of bilayer unit cells as disclosed herein, alternative embodiments would include the use of one or more of the embodiment herein to form single and multiple layer (e.g. trilayer, etc.) unit cells for ferroelectric polymer memory devices.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming a memory device, comprising:
    providing a semiconductor structure;
    forming a first insulator layer having a flat top surface above said semiconductor structure; and, subsequently,
    forming a trench in said first insulator layer, wherein said trench has a depth less than the thickness of said first insulator layer;
    forming a first adhesion layer above said first insulator layer and in said trench;
    forming a first conductive layer above said first adhesion layer, wherein said first adhesion layer binds said first conductive layer to said first insulator layer;
    planarizing said first conductive layer and said first adhesion layer to form a first electrode in said trench, wherein the top surface of said first electrode is planar with the top surface of said first insulator layer;
    forming a first ferroelectric polymer layer having a flat top surface above said first electrode and said first insulator layer;
    forming a second conductive layer having a flat top surface above said first ferroelectric polymer layer;
    forming a second adhesion layer having a flat top surface above said second conductive layer;
    subtractively patterning said second adhesion layer and said second conductive layer to form a second electrode above said first ferroelectric polymer layer, wherein said second electrode comprises a conductive portion and an adhesion portion;
    forming a second insulator layer having a flat top surface above said second electrode, wherein said adhesion portion of said second electrode binds said conductive portion of said second electrode with said second insulator layer;
    forming a series of trenches in said second insulator layer to expose regions of said first and said second electrodes; and
    forming a contact conductive layer in said series of trenches to form a series of contacts to said first and second electrodes.

2. The method of claim 1 wherein said first and second adhesion layers are comprised substantially of titanium, and wherein said first and second conductive layers are comprised substantially of a noble metal.

3. The method of claim 1 wherein said first and second adhesion layers are comprised substantially of an organic material.

4. The method of claim 3, further comprising:
    subsequent to forming said third electrode and prior to forming said second insulator layer, forming a third ferroelectric polymer layer above said third electrode.

5. The method of claim 1 wherein said first ferroelectric polymer layer is comprised substantially of poly(vinylidene fluoride-trifluoroethylene).

6. The method of claim 1, further comprising:
    subsequent to forming said second electrode and prior to forming said second insulator layer, forming a second ferroelectric polymer layer above said second electrode;
    forming a third conductive layer above said second ferroelectric polymer layer;
    forming a third adhesion layer above said second conductive layer;
    subtractively patterning said third adhesion layer and said third conductive layer to form a third electrode above said second ferroelectric polymer layer, wherein the compositions of said second ferroelectric polymer layer and said third conductive layer are selected such that said second ferroelectric polymer layer is not impacted during the subtractive patterning of said third conductive layer.

7. The method of claim 1 wherein the compositions of said first ferroelectric polymer layer and said second conductive layer are selected such that said first ferroelectric polymer layer is not impacted during the subtractive patterning of said second conductive layer.

* * * * *

UNITED STATES PATENT AND TRADEMARK OFFICE
CERTIFICATE OF CORRECTION

| | | |
|---|---|---|
| PATENT NO. | : 7,344,897 B2 | Page 1 of 1 |
| APPLICATION NO. | : 11/124497 | |
| DATED | : March 18, 2008 | |
| INVENTOR(S) | : Diana et al. | |

It is certified that error appears in the above-identified patent and that said Letters Patent is hereby corrected as shown below:

In column 1, at line 55, delete "position" and insert --poison--.

Signed and Sealed this

Twenty-fifth Day of November, 2008

JON W. DUDAS
*Director of the United States Patent and Trademark Office*